United States Patent [19]
Sauer et al.

[11] 4,191,896
[45] Mar. 4, 1980

[54] LOW NOISE CCD INPUT CIRCUIT

[75] Inventors: Donald J. Sauer, Plainsboro; Peter A. Levine, Trenton, both of N.J.

[73] Assignee: RCA Corporation, New York, N.Y.

[21] Appl. No.: 708,397

[22] Filed: Jul. 26, 1976

[51] Int. Cl.² ............... G11C 19/28; H01L 29/78; H03K 5/08; H03K 1/12
[52] U.S. Cl. ............... 307/221 D; 357/24; 307/237; 307/297
[58] Field of Search ......... 357/24; 307/221 C, 221 D, 307/205, 304, 237, 296, 297

[56] References Cited
U.S. PATENT DOCUMENTS

| | | | |
|---|---|---|---|
| 3,881,117 | 4/1975 | Tompsett | 357/24 |
| 3,986,198 | 10/1976 | Kosonocky | 357/24 |

OTHER PUBLICATIONS

Sequin "Linearity of Electrical Charge Injection into Charge-Coupled Devices", IEEE J. Solid-State Circuits, vol. SC-10, (4/75), pp. 81–92.

Askin et al., "Bit Line Bias Circuit with High-Noise Immunity", IBM Technical Disclosure Bulletin, vol. 17, (3/75), pp. 2923–2924.

Primary Examiner—Gene M. Munson
Attorney, Agent, or Firm—H. Christoffersen; Samuel Cohen

[57] ABSTRACT

A "fill and spill" charge coupled device (CCD) input circuit in which the source electrode is clamped to a voltage level ($V_T + \Delta V$) lower than that of the input gate electrode during the fill operation, where ($V_T + \Delta V$) is the gate-to-source voltage of a field effect transistor during conduction. The field effect transistor and input gate electrode are integrated onto the same semiconductor substrate and therefore exhibit the same threshold voltage $V_T$ so that the difference between the surface potential at the source electrode and the surface potential beneath the input gate electrode is independent of $V_T$.

7 Claims, 3 Drawing Figures

LOW NOISE CCD INPUT CIRCUIT

The present application relates to charge coupled device (CCD) input circuits and particularly to those of the "fill and spill" type.

Figure 1:
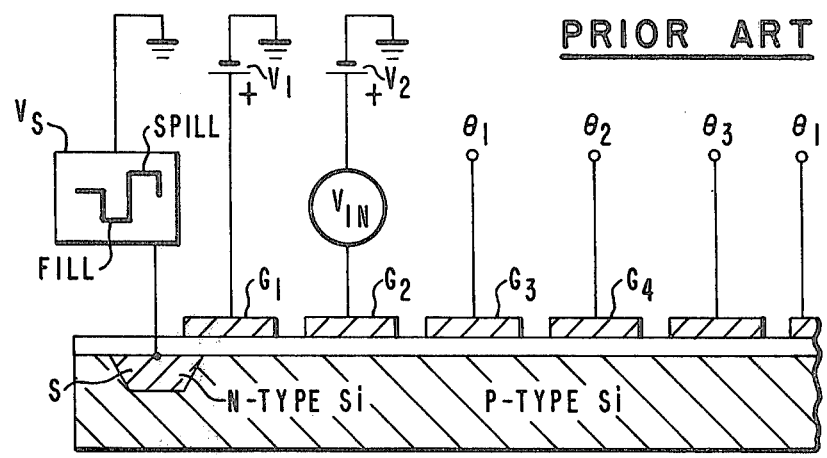
FIG. 1 is a schematic showing of a known CCD input circuit.

Copending U.S. application Ser. No. 565,563, filed Apr. 7, 1975, now U.S. Pat. No. 3,986,198, issued Oct. 12, 1976 which is a continuation of U.S. application Ser. No. 369,580, filed June 13, 1973, by Walter F. Kosonocky for "Introducing Signal at Low Noise Level to Charge Coupled Circuit" and assigned to the same assignee as the present application, describes relatively noise-free circuits for introducing a charge signal into a CCD register. FIG. 1 of the present application illustrates a typical such circuit. It includes an input region S of the CCD, which may be a diffusion of opposite conductivity than the substrate and a plurality of electrodes including $G_1$–$G_4$. Gate electrode $G_1$ is held at a voltage $V_1$ to create in the gate region of the substrate (the region beneath $G_1$) a shallow potential well—which operates here as a potential barrier ($W_1$ of FIG. 2). A voltage applied to storage electrode $G_2$ creates a deeper potential well in the storage region of the substrate beneath this electrode than beneath $G_1$. This voltage may include a bias component $V_2$ and a signal component $V_{IN}$, where $V_{IN}$ is effectively applied between electrodes $G_1$ and $G_2$. Transfer electrode $G_3$ is held at a voltage $\phi_1$ which is less positive than $V_1$ during the fill and spill operation. Thus the barrier $W_3$ beneath $G_3$ is higher than barrier $W_1$ beneath $G_1$.

During the "fill" portion of the operation, region S is pulsed relatively negatively and operates as a source of charge carriers. In the example of the CCD illustrated, which is a surface channel CCD, the substrate is of P-type and the diffusion S is of N type so that the charge carriers are electrons. The electrons pass over the potential barrier $W_1$ (FIG. 2) beneath gate electrode $G_1$ and fill the potential well beneath the storage electrode $G_2$ to a level proportional to the difference in potential between that of region S and the surface potential $W_2$ beneath electrode $G_2$. The potential barrier $W_3$ prevents any of the charge signal from flowing down the CCD register.

Figure 2:
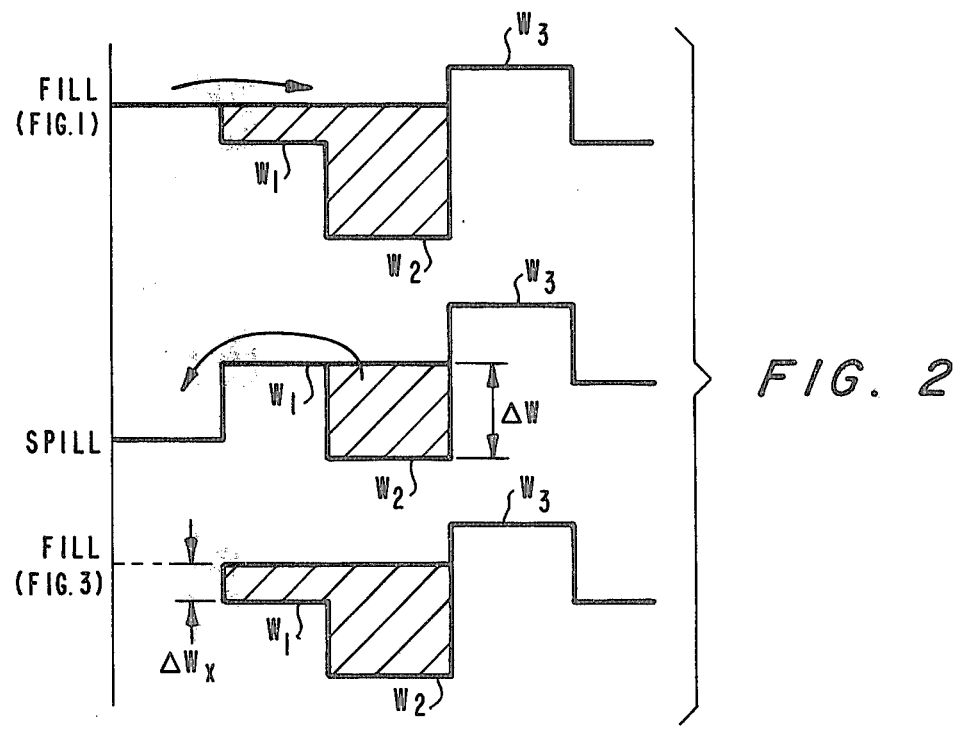
FIG. 2 is a drawing of surface potentials to help explain the operation of the circuits of FIGS. 1 and 3.

After the filling operation, the potential of the source S is made relatively more positive to cause region S to operate as a drain for charge carriers. This occurs during the time the input signal $V_{IN}$ is present. The excess charge in the potential well now spills back over the first potential barrier $W_1$ to the drain S, and there remains in the potential well a charge which has a component proportional to the input signal $V_{IN}$ and which also has a dc component proportional to $V_2-V_1$ (in the limiting case, $V_2-V_1$ may equal zero). This charge is represented in FIG. 2 as a difference in surface potentials $\Delta W$ between the regions of the substrate beneath electrodes $G_1$ and $G_2$, respectively.

It is important in the fill and spill operation described above that the potential of the input diffusion S during the fill operation be between the two limits $W_1$ and $W_3$. It must be greater than surface potential $W_1$ to insure that charge carriers (electrons) pass over the barrier $W_1$ and fill the first potential well. However, it must be less than surface potential $W_3$ to prevent electrons from flowing over the barrier $W_3$ and down the CCD channel. The present application relates to a circuit for insuring such operation.

Figure 3:
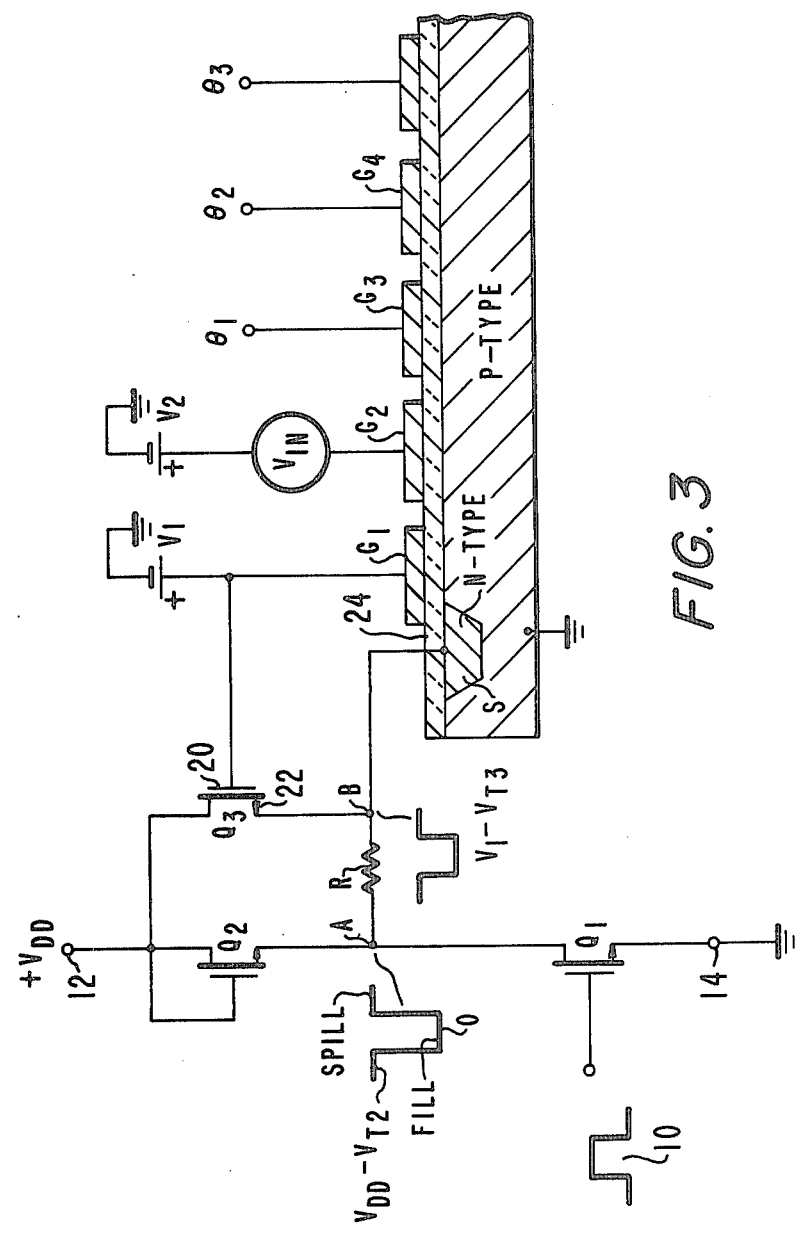
FIG. 3 is a schematic showing of a CCD input circuit embodying the present invention.

An embodiment of the invention is shown in FIG. 3. It includes three N-channel, field effect transistors of the MOS enhancement type. Transistors $Q_1$ and $Q_2$ are connected to operate as an inverter. The drain electrode of transistor $Q_1$ is connected to the source electrode of transistor $Q_2$ and the gate electrode of transistor $Q_2$ is connected to its drain electrode. Transistor $Q_2$, in other words, is connected to operate as a load for transistor $Q_1$. The drain electrode of transistor $Q_2$ is connected to one terminal 12 of an operating voltage ($V_{DD}$) source and the source electrode of transistor $Q_1$ is connected to the other terminal 14, shown here as ground, of the operating voltage source. A third transistor $Q_3$ is connected at its gate electrode to the input gate electrode $G_1$ of the CCD and is connected at its drain electrode to the drain electrode of transistor $Q_2$. The source electrode of transistor $Q_3$ is connected to the source-drain connection of transistors $Q_2$ and $Q_1$, respectively via resistor R. The source electrode of transistor $Q_3$ is connected also to the source electrode S of the CCD. In practice, this entire circuit is integrated onto the same substrate as the CCD. Resistor R and transistor $Q_1$ together may be considered a current source.

In operation, a positive pulse 10 is applied to the gate electrode of transistor $Q_1$ to initiate the fill operation. This pulse turns on transistor $Q_1$ and an inverted and amplified version thereof appears at node A of the circuit at the drain electrode of transistor $Q_1$. This negative pulse is substantially at ground level as the conduction path of transistor $Q_1$ exhibits low resistance. When node A goes to ground, it attempts to pull node B to ground. However, the gate electrode of transistor $Q_3$ is held at a voltage level $V_1$ and when node B goes more negative than $V_1$ by the threshold voltage $V_{T3}$ of transistor $Q_3$, transistor $Q_3$ starts to conduct. This initially places node B at the voltage level $V_1-V_{T3}$.

As already mentioned, the transistor $Q_3$ (and the others too) are integrated on the same semiconductor substrate as the CCD. Thus, the gate electrode 20 of transistor $Q_3$, in practice, can be an extension of the gate electrode of $G_1$ and the source electrode 22 can be an extension of the source electrode S. As transistor $Q_3$ is formed by the same processing steps and at the same time as the CCD electrodes, the threshold voltage $V_{T3}$ of transistor $Q_3$ is exactly the same as the the threshold voltage of the gate electrode $G_1$ relative to source S. This holds even if the thickness of the insulation layer 24 cannot be accurately predicted because the thickness of the layer beneath gate electrode $G_1$ will be exactly the same as that beneath gate electrode 20, and the same thing is true for other parameters which may be difficult to control during the manufacturing process.

At the instant transistor $Q_3$ starts to conduct therefore, the voltage $V_S$ at the source electrode of transistor $Q_3$ will be exactly the same as the surface potential $W_1$ beneath the gate electrode $G_1$, even though it may not be possible to predict exactly what $W_1$ may be from the value of $V_1$ applied to electrode $G_1$.

The current passing through the conduction path of transistor $Q_3$ will increase in value from its initial value to some final value, the latter being a function, among other things, of the bias voltage $V_1$, the value of resistance R, and the values of the conduction path resistances of transistor $Q_1$ and $Q_3$. This final value of current establishes a voltage at node B equal to $V_1-(V_{T3}+\Delta V)$, where $\Delta V$ depends upon the current flowing through the conduction path of transistor $Q_3$. In a practical circuit, assuming a surface channel CCD such as illustrated and an enhancement type, N channel transistor such as illustrated, $V_{T3}$ may be a volt or so and $\Delta V$ a half volt or so. The present invention is also applicable to buried channel devices in which case an MOS transistor of the depletion type would be used for $Q_3$. In that case, $V_{T3}$ may be of the order of minus eight volts or so and $\Delta V$ about a half volt or so.

An important feature of the circuit of FIG. 3 is that even though it may not be possible accurately to predict the surface potential $W_1$ beneath the gate electrode $G_1$, the source electrode S is established at a surface voltage which is a substantially fixed difference in potential from $W_1$. In the example of the invention illustrated, this difference in surface potential ($\Delta W_X$ in FIG. 2) is equal to $\Delta V$ in the equation above. This is most important in applications where large numbers of CCD's must be manufactured and where it may not be possible to obtain the same value of surface potential $W_1$ in response to a given voltage $V_1$ from one device to the other because of small, uncontrollable differences in manufacturing parameters from one device to another.

Another feature of the circuit is that it is relatively insensitive to drift in various voltages such as $V_1$ or to changes in such parameters as temperature or the like. If $V_1$ should increase or decrease some reasonable amount (say 10-25% or so) the voltage at the source electrode S will still be offset $V_{T3}+\Delta V$ therefrom (although $\Delta V$ may differ slightly from its original value). Similarly, changes in temperature which tend to change the threshold voltage of gate electrode $G_1$ will change in the same sense and amount the threshold voltage of the gate electrode of transistor $Q_3$ and thus have no effect on the circuit operation.

During the fill portion of the operation, the voltage at the source electrode S is related to the voltage at the gate electrode $G_1$ in the manner already discussed. The voltage at the gate electrode $G_1$ is substantially more positive than the transfer voltage $\phi_1$ on the gate electrode $G_3$. That is, the potential barrier $W_3$ is substantially higher than the potential barrier $W_1$. Accordingly, during the fill operation, the potential of the source electrode S is at a level such that electrons cannot flow over the barrier $W_3$ and down the CCD channel.

The circuit illustrated is just one example of a circuit for clamping diffusion S at a level related to that of gate electrode $G_1$ during the fill operation. Other circuits are possible. For example, resistor R can be reduced in value to zero if the conduction channel impedance of transistor $Q_3$ is relatively low compared to that of transistor $Q_1$. As another alternative, a different form of inverter can be used for transistors $Q_1$ and $Q_2$ than the one illustrated. For example, the inverter may be of the dynamic rather than the static type. As a second alternative, a complementary-symmetry inverter may be employed rather than one formed of N channel MOS transistors such as illustrated. Here, the P channel one of the inverter transistors would be employed for transistor $Q_2$.

The spill portion of the operation is relatively straightforward. It occurs when the input control signal 10 goes relatively negative, driving node A to a voltage level $V_{DD}-V_{T2}$, where $V_{T2}$ is the threshold voltage of transistor $Q_2$. This voltage is such that transistor $Q_3$ is cut off so that the voltage $V_B$ at node B is equal to that at node A. The source S now acts as a drain for electrons and the spill operation proceeds in the same manner as already discussed in connection with FIG. 1. After the spill operation is completed, the charge which is stored beneath electrode $G_2$ is propagated down the CCD channel by appropriate adjustment of the multiple phase voltage $\phi_1-\phi_3$.

While the invention has been illustrated in terms of a surface channel CCD employing a P type substrate, it is of course to be understood that an N type substrate can be employed instead with a P type region for the source electrode S. It is also to be understood that the teachings of the present application are applicable to buried channel CCD's as well as surface channel CCD's.

What is claimed is:

1. In an input circuit for a CCD which includes a substrate: an input region in the substrate of opposite conductivity than the substrate; a gate region of the substrate adjacent to the input region; a storage region of the substrate adjacent to the gate region; means including electrodes over said gate and storage regions, a signal source coupled between said electrodes, and a bias voltage source connected to said electrode over said gate region, for producing a shallower potential well in said gate region than in said storage region; and means for filling said potential well beneath said electrode over said storage region comprising means for applying a voltage to said input region for causing the same to emit charge carriers which pass through said shallower well to the potential well in said storage region, the improvement comprising:

means responsive to the bias voltage applied to said electrode over said gate region for maintaining said input region at a substantially fixed potential offset greater than zero from said electrode over said gate region during the period said potential well of said storage region is being filled.

2. In a charge coupled circuit which includes a semiconductor substrate, source electrode means in the substrate, storage electrode means insulated from the substrate, and gate electrode means insulated from the substrate and located between the storage electrode means and said source electrode means for controlling the flow of charge between the source electrode means and the substrate region beneath the storage electrode means in combination:

means coupled to said gate electrode means and to said storage electrode means, including means for applying between said gate electrode means and said storage electrode means a signal potential which may vary, and means supplying a bias potential, for creating a first potential well beneath the storage electrode means and a shallower second potential well beneath the gate electrode means;

means for creating a potential difference between said source electrode means and said storage electrode means during a first time period, for causing a flow of charge from said source electrode means to said first potential well in an amount independent of said signal potential, said means including means responsive to that portion of said bias potential which is applied to said gate electrode means for clamping said source electrode means at a fixed offset voltage relative to the voltage at said gate electrode means; and means for changing the potential difference between said storage electrode means and said source electrode means, during a second time period following the first in a sense to return charge from the potential well beneath said storage electrode means to said source electrode means to an extent to leave stored beneath said storage electrode means an amount of charge dependent on said signal potential.

3. In an input circuit for a CCD which includes a substrate: an input region in the substrate of opposite conductivity than the substrate; a gate region of the substrate adjacent to the input region; a storage region of the substrate adjacent to the gate region; means including electrodes over said gate and storage regions, a signal source coupled between said electrodes, and a bias voltage source connected to said electrode over said gate region, for producing a shallower potential well in said gate region than in said storage region; and means for filling said potential well beneath said electrode over said storage region comprising means for applying a voltage to said input region for causing the same to emit charge carriers which pass through said shallower well to the potential well in said storage region, the improvement comprising:

means responsive to the bias voltage applied to said electrode over said gate region for maintaining said input region at a substantially fixed potential offset greater than zero from said electrode over said gate region during the period said potential well of said storage region is being filled, said means responsive to said bias voltage comprising a field effect transistor integrated onto the same substrate as said CCD and having source, drain and gate electrodes, connected at its gate electrode to said bias voltage source at its source electrode to said input region and at its drain electrode to a terminal for an operating voltage, said voltage applied to said input region for causing the same to emit charge carriers comprising a voltage of a sense and amplitude to cause conduction through said transistor.

4. In an input circuit as set forth in claim 3, said means for applying a voltage to said input region comprising a current source, that is, a source exhibiting a substantial internal resistance.

5. In an input circuit as set forth in claim 3, said means for applying a voltage to said input region comprising a field effect transistor inverter including a second field effect transistor having source, drain and control electrodes, connected at its source electrode to a point at a reference potential, an impedance, said second transistor coupled at its drain electrode through said impedance to said operating voltage terminal, means coupling said drain electrode of said second transistor to said input region, and means for applying a turn-on pulse to said gate electrode of said second transistor.

6. In a charge coupled circuit which includes a semiconductor substrate, source electrode means in the substrate, storage electrode means insulated from the substrate, and gate electrode means insulated from the substrate and located between the storage electrode means and said source electrode means for controlling the flow of charge between the source electrode means and the substrate region beneath the storage electrode means, in combination:

means coupled to said gate electrode means and to said storage electrode means, including means for applying between said gate electrode means and said storage electrode means a signal potential which may vary, and means supplying a bias potential, for creating a first potential well beneath the storage electrode means and a shallower second potential well beneath the gate electrode means;

means for creating a potential difference between said source electrode means and said storage electrode means during a first time period, for causing a flow of charge from said source electrode means to said first potential well in an amount independent of said signal potential, said means including means for clamping said source electrode means at a fixed offset voltage relative to the voltage at said gate electrode means;

means for changing the potential difference between said storage electrode means and said source electrode means, during a second time period following the first in a sense to return charge from the potential well beneath said storage electrode means to said source electrode means to an extent to leave stored beneath said storage electrode means an amount of charge dependent on said signal potential; and said means for clamping comprising a semiconductor device of the type which exhibits between two of its electrodes, when it conducts, a voltage $(V_T + \Delta V)$ where $V_T$ is independent of the magnitude of current conducted through said device and $\Delta V$ is a function of said magnitude, said device being connected at one electrode to said source electrode means and at said other electrode to said gate electrode means, and means for driving said device into conduction.

7. In a charge coupled circuit as set forth in claim 6, said semiconductor device comprising a MOS transistor having source, drain and gate electrodes, connected at its gate electrode to said gate electrode means and at its source electrode to said source electrode means, and connected at its drain electrode to a terminal for an operating voltage.

* * * * *